(12) United States Patent
Runals et al.

(10) Patent No.: US 7,049,989 B2
(45) Date of Patent: May 23, 2006

(54) UNIFIED ANALOG INPUT FRONT END APPARATUS AND METHOD

(75) Inventors: Andrew W. Runals, Middleville, MI (US); Samuel C. Neis, Grand Rapids, MI (US)

(73) Assignee: Smiths Aerospace LLC, Grand Rapids, MI (US)

( * ) Notice: Subject to any disclaimer, the term of this patent is extended or adjusted under 35 U.S.C. 154(b) by 0 days.

(21) Appl. No.: 10/954,485

(22) Filed: Oct. 1, 2004

(65) Prior Publication Data

US 2006/0071838 A1    Apr. 6, 2006

(51) Int. Cl.
*H03M 1/12* (2006.01)

(52) U.S. Cl. ...................................... 341/139; 341/120

(58) Field of Classification Search ................. 341/120, 341/139
See application file for complete search history.

(56) References Cited

U.S. PATENT DOCUMENTS

| | | | | |
|---|---|---|---|---|
| 4,016,557 A | * | 4/1977 | Zitelli et al. ................. | 341/139 |
| 5,089,820 A | * | 2/1992 | Gorai et al. ................. | 341/139 |
| 5,146,155 A | * | 9/1992 | Trinh Van et al. ......... | 324/99 D |
| 5,841,385 A | * | 11/1998 | Xie ............................ | 341/139 |
| 6,603,416 B1 | * | 8/2003 | Masenas et al. ............ | 341/120 |

* cited by examiner

*Primary Examiner*—Howard L. Williams
(74) *Attorney, Agent, or Firm*—Foley & Lardner LLP

(57) ABSTRACT

An analog input front end includes a configurable gain stage and an analog-to-digital converter. The configurable gain stage receives an analog input signal, such as a differential analog input signal, and provides a gain value to the analog input signal so as to output a gain-adjusted analog input signal that is within a particular voltage range between a maximum and a minimum value. The analog-to-digital converter receives the gain-adjusted analog input signal and performs analog-to-digital conversion on the gain-adjusted analog input signal, so as to output a digital signal that is indicative of the analog input signal.

13 Claims, 9 Drawing Sheets

UNIFIED ANALOG INPUT FRONT END APPARATUS AND METHOD

BACKGROUND OF THE INVENTION

The present invention relates generally to the front end systems. In particular, the present invention relates to a unified analog input front end apparatus and method.

Many specialized circuits exist to measure specific types of signals. The diversity of these circuits makes it difficult to plan exactly what quantities and which types should be included in a particular application. This is especially the case for an application that requires re-use on different types of platforms, such as on different types of aircraft.

Accordingly, it is desirable to have a unified analog input front end that can be utilized for different types of applications and on different types of platforms.

SUMMARY OF THE INVENTION

One aspect of the invention relates to an analog input front end. The analog input front end includes a configurable gain stage and an analog-to-digital converter. The configurable gain stage receives an analog input signal, such as a differential analog input signal, and provides a gain value to the analog input signal so as to output a gain-adjusted analog signal within a particular voltage range compatible with the input range of the Analog to Digital Converter. The analog-to-digital converter receives the gain-adjusted analog input signal and performs analog-to-digital conversion on the gain-adjusted analog input signal, so as to output a digital signal that is indicative of the analog input signal.

Another aspect of the invention relates to a method of converting an analog input signal to a digital signal, which includes receiving, by a configurable gain stage, the analog input signal. The method also includes providing, by the configurable gain stage, a gain value to the analog input signal so as to output a gain-adjusted analog input signal that is within a particular voltage range between a maximum and a minimum value. The method further includes receiving, by an analog-to-digital converter, the gain-adjusted analog input signal output from the configurable gain stage. The method still further includes performing, by the analog-to-digital converter, analog-to-digital conversion on the gain-adjusted analog input signal, so as to output a digital signal that is indicative of the analog input signal.

Yet another aspect of the invention relates to a configurable gain stage, which includes a positive differential input signal stage that includes a first resistor having a first resistance value, a second resistor having a second resistance value, and a first operational amplifier. The configurable gain stage also includes a negative differential input signal stage that includes a third resistor having the first resistance value, a fourth resistor having the second resistance value, and a second operational amplifier. The configurable gain stage further includes first through sixth switches, the first and second switches being provided on the positive differential input signal stage, the third and fourth switches being provided on the negative differential input signal stage, the fifth switch being provided between the positive and negative differential input signal stages, and the sixth switch being provided between a ground potential and at least one of the positive and negative differential input signal stages. The configurable gain stage is capable of operating in a first mode of operation providing a gain value greater than unity to an input differential signal pair, a second mode of operation providing a unity gain value to the input differential signal pair, and a third mode of operation provide a gain value greater than zero but less than unity to the input differential signal pair Yet another aspect of the invention relates to a calibration circuit for a gain stage and analog-to-digital converter unit. The calibration circuit includes an operational amplifier, a digital-to-analog converter, a resistor ladder provided between the operational amplifier and the digital-to-analog converter, a voltage reference unit connected to the digital-to-analog converter and a plurality of switches that provide an on/off connection to the gain stage and the analog-to-digital converter unit. The calibration circuit is configured to maintain a total error of the gain stage and the analog-to-digital converter unit to be less than a predetermined value, for all operating modes of the gain stage and the analog-to-digital converter.

Other features and advantages of the present invention will become apparent to those skilled in the art from the following detailed description and accompanying drawings. It should be understood, however, that the detailed description and specific examples, while indicating preferred embodiments of the present invention, are given by way of illustration and not limitation. Many modifications and changes within the scope of the present invention may be made without departing from the spirit thereof, and the invention includes all such modifications.

BRIEF DESCRIPTION OF THE DRAWINGS

The exemplary embodiments will hereafter be described with reference to the accompanying drawings, wherein like numerals depict like elements, and.

DETAILED DESCRIPTION OF THE PREFERRED EMBODIMENTS

In the following description, for the purposes of explanation, numerous specific details are set forth in order to provide a thorough understanding of the present invention. It will be evident to one skilled in the art, however, that the exemplary embodiments may be practiced without these specific details. In other instances, structures and device are shown in diagram form in order to facilitate description of the exemplary embodiments.

Figure 1:
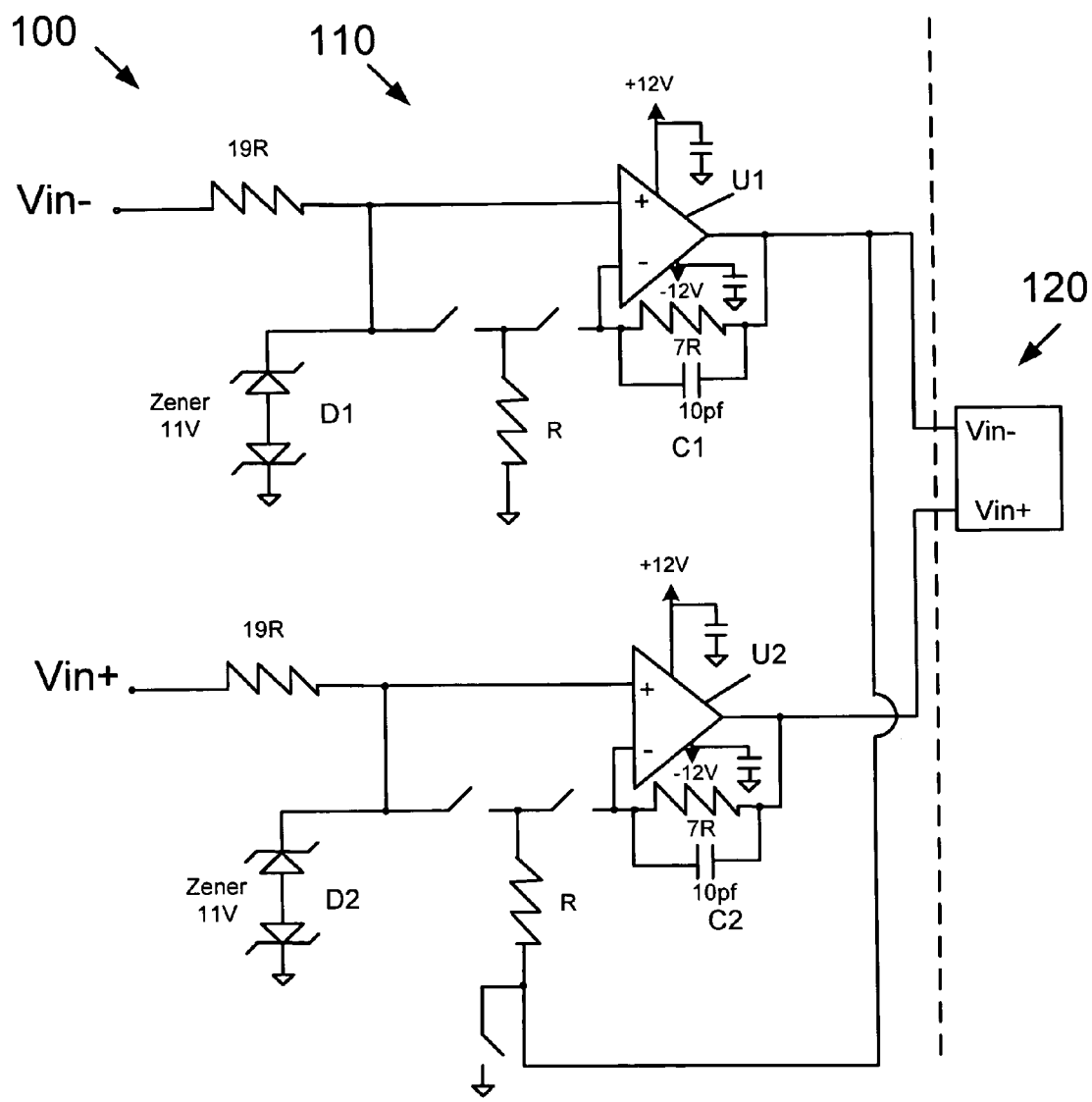
FIG. 1 is a circuit level diagram illustrating an overall topology of a unified analog input front end according to a first embodiment of the invention.

Referring now to FIG. 1, an overall topology of a unified analog input front end according to a first embodiment of the invention is shown. The unified analog input front end is a high-performance yet very general purpose analog signal processing and conversion circuit for data acquisition. It is configurable in real-time by way of digital commands which can set the unified analog input front end to perform analog-to-digital (A-to-D) conversion on input signals, such as differential signals, in a plurality of full-scale ranges. In the preferred embodiment, there are twelve (12) possible full-scale ranges, from ±0.3125 Volts to ±200 Volts for a differential input signal pair. Of course, other full-scale ranges may be possible for a unified analog input front end made in accordance with the present invention.

The unified analog input front end is capable of performing signal processing and conversion for analog input signals from D.C. up to a predetermined frequency. In the preferred embodiment, the predetermined frequency is 500 Hz, but of course it may be set to any desired frequency to suit a particular purpose, as known to one of ordinary skill in the art (e.g., a value between 50 Hz and 10 kHz).

The unified analog input front is designed to have a 14 bit resolution and an accuracy of better than 1% full scale. This is accomplished with a carefully developed and very flexible topology and by the use of custom designed components, such as ones manufactured by Maxim Integrated Products, Inc., and by Alpha, Inc.

A first embodiment of the invention will be described with reference to FIG. 1, which shows an overall circuit that makes up the unified analog input front end. The unified analog input front end 100 includes a configurable gain stage 110 constructed of discrete components, and an analog-to-digital converter 120. In the preferred embodiment, the analog-to-digital converter 120 is a Max1338 A/D converter manufactured by Maxim Integrated Products, Inc., but one of ordinary skill in the art will recognize that other types of converters may be utilized for the analog-to-digital converter 120 portion of the unified analog input front end 100, while remaining within the scope of the invention. The variable full scale range discussed herein is a function of the Max 1338, and other types of A/D converters that may be utilized with a unified analog input front end according to an embodiment of the present invention may or may not have such a feature.

In the preferred embodiment, the configurable gain stage 110 provides three (3) separate gain settings, and the analog-to-digital converter 120 provides four (4) separate gain settings (actually, full scale settings for the A/D), to thereby have 3×4=12 full-scale ranges for the unified analog input front end 100.

Figure 2:
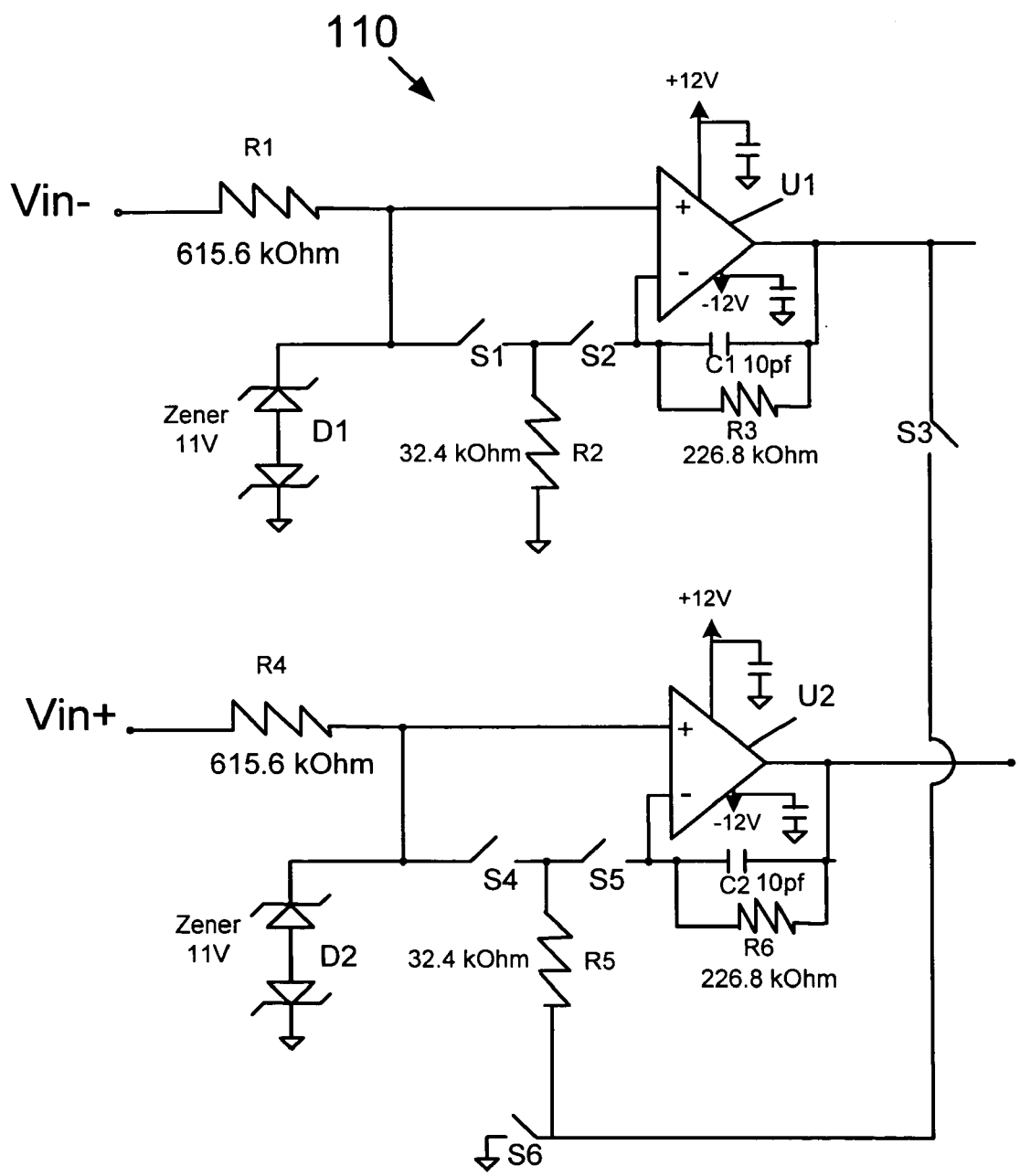
FIG. 2 is a circuit level diagram illustrating the configurable gain stage portion of the unified analog input front end, with actual resistance values and capacitance values provided in a preferred configuration of the first embodiment.

Referring to FIG. 1 and to FIG. 2, the configurable gain stage 110 includes a first resistor R1 with a resistance value of 19R (R being a predetermined value), a second resistor R2 with a resistance value of R, a third resistor R3 with a resistance value of 7R, a first capacitor C1 with a capacitance value of C, a first Zener diode D1, a first operational amplifier U1, a fourth resistor R4 with a resistance value of 19R, a fifth resistor R5 with a resistance value of R, a sixth resistor R6 with a resistance value of 7R, a second capacitor C2 with a capacitance value of C, a second Zener diode D2, and a second operational amplifier U2. Also included in the unified analog input front end 100 is a first switch S1, a second switch S2, a third switch S3, a fourth switch S4, a fifth switch S5 and a sixth switch S6, whereby the disposition of the switches S1–S6 determines the particular gain setting of the configurable gain stage 110.

In FIG. 1, a positive differential input signal (of a differential input signal pair) is input to the first resistor R1, and a negative differential input signal (of the differential input signal pair) is input to the fourth resistor R4, whereby the unified analog input front end 100 is configured to determine a digital value corresponding to the differential input signal.

The configurable gain stage 110 serves three basic purposes: a) to attenuate large signals which are beyond the A/D converter's 120 input signal range and that could damage the A/D converter 120, b) to amplify small signals which less than the input signal range of the A/D converter 120, and c) to serve as a high input impedance/low output impedance buffer for signal sources which may be attenuated by the relatively low input impedance (around 15K Ohm) of the A/D converter 120.

The three different gain configurations of the configurable gain stage 110 are selectable by way of digitally controlled analog switches S1–S6. R1–R3 and R4–R6 are preferably resistors custom-packaged in threes, such as ones sold by Alpha, Inc. In the preferred embodiment, each of the resistor packs meet a 19:1:32 resistance ratio with 0.02% accuracy.

OpAmps U1 and U2 are preferably high precision, low bias current, low offset voltage operational amplifiers. Capacitors C1 and C2 are 10 pF capacitors in the preferred embodiment, whereby they are included so as to provide some filtering and oscillation protection to the OpAmps U1 and U2, while keeping the high end of the low-pass filter they create well above a predetermined frequency range. In the preferred embodiment, the predetermined frequency range (for signals input to the unified analog input front end 100) is D.C. (0 Hz) to 500 Hz, which is the range of signals the unified analog input front end 100 is designed to measure. Zener Diodes D1 and D2 are used to protect the OpAmps U1 and U2 and the switches S1–S6 from voltages beyond their rails, whereby the Zener Diodes D1 and D2 are configured as back-to-back diodes (for bipolar signals).

Figure 3:
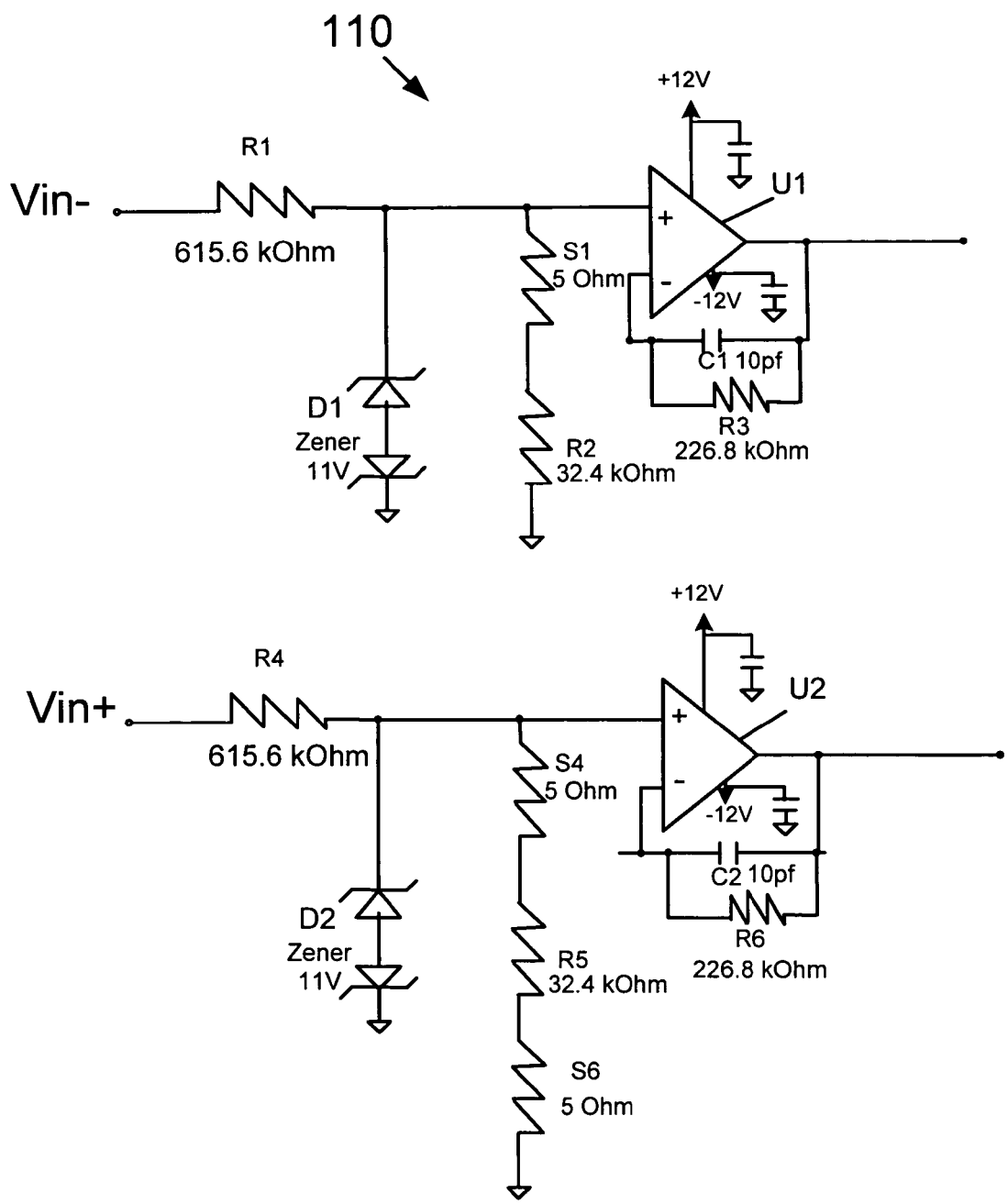
FIG. 3 is a circuit level diagram illustrating the configurable gain stage operating in attenuation mode.

FIG. 3 illustrates the topology of the configurable gain stage 110 when switched to attenuation mode, with a gain of 0.05, whereby actual resistance and capacitance values are shown in a preferred implementation of the configurable gain stage 110. This mode of operation is useful when the input voltage range is large, such as a ±200 V input range, whereby that large input range is collapsed to a ±10V input range that is suitable for input to an A/D. In the attenuation mode, switches S1, S4 and S6 are closed, while all of the other switches (S2, S3 and S5) are open. In FIG. 3, the switches S1–S6 are represented by 5 Ω resistances, to represent the maximum on-resistance of the Maxim Max4665 switches that are used in the preferred implementation of the configurable gain stage 110.

In this mode of operation, the configurable gain stage 110 functions as a voltage divider, whereby the gain of the configurable gain stage 110 is:

$$G_- = (R_2 + R_{S1})/(R_1 + R_2 + R_{S1}) \text{ (for the neg. leg)} \quad (1)$$

$$G_+ = (R_5 + R_{S4} + R_{S6})/(R_4 + R_5 + R_{S4} + R_{S6}) \text{ (for pos. leg)} \quad (2)$$

In this case, there is no gain provided by the op-amps U1 and U2, whereby the voltage drops across resistors R3 and R6 are dependant only on the bias current of the inverting inputs to the op amps U1 and U2.

So, the gain of a differential signal is computed as:

$$G = V_{outdiff} / V_{indiff} \quad (3)$$

$$= G_+ V_+ - G_- V_- / V_{indiff} \quad (4)$$

$$= G_+(V_{incm} + V_{indiff}/2) - G_-(V_{incm} - V_{indiff}/2)/V_{indiff} \quad (5)$$

$$= V_{indiff}(G_+ + G_-)/2 + V_{incm}(G_+ - G_-)/V_{indiff} \quad (6)$$

$$G = (G_+ + G_-)/2 + K(G_+ - G_-) \quad (7)$$

where $K=V_{incm}/V_{indiff}$, the ratio of input common mode to input differential.

In an ideal case, in the preferred embodiment, $R1=R4=615.6$ k$\Omega$, $R2=R5=32.4$ k$\Omega$, and all switch resistances are zero, for a gain of:

$$G=G_+=G_-=32.4/(615.6+32.4)=0.05000 \quad (8)$$

Gain Error is introduced by the tolerance of the resistors (0.02% tolerance for the resistors used in the preferred embodiment) and the resistance of the switches (3–5 $\Omega$ for the Max 4665 switches used in the preferred embodiment). From Equation #7, above, it can be seen that Gain Error can occur either as a result of an average error common to both the positive and negative differential legs (in the first term) or mismatched error proportional to the common mode ratio K (in the second term).

Maximum and minimum gains for each leg are computed as:

$$G_{+MAX} = (32406.48 + 5 + 5)/(615476.88_- + 32406.48 + 5 + 5) \quad (9)$$
$$= 0.050033666$$

$$G_{+MIN} = (32393.52 + 3 + 3)/(32393.52_- + 615723.12 + 3 + 3) \quad (10)$$
$$= 0.049989798$$

$$G_{-MAX} = (32406.48 + 5)/(615476.88_- + 32406.48 + 5) \quad (11)$$
$$= 0.050026335$$

$$G_{-MIN} = (32393.52 + 3)/(32393.52_- + 615723.12 + 3) \quad (12)$$
$$= 0.049985401$$

In a case where the signal is evenly distributed across ground ($V_{incm}=K=0$), the largest error would correspond to the pair of gains above which have the greatest absolute average difference from 0.05. Thus, $$G=(G_{+MAX}+G_{-MAX})/2=0.050030001 \quad (13)$$

For a Gain Error of 0.060001%.

The largest error is dependent on the largest average error of the two legs for K≲0.5 (the point at which the negative leg is grounded). For K>0.5, the maximum error % is computed as:

$$G_{ERRMAX\%}=(G_{+MAX}+G_{-MAX})/2-0.05+K(G_{+MAX}+G_{-MAX}))/0.05*100 \quad (14)$$

So, error is proportional to common mode, and becomes a limiting factor of common mode, based upon the percent of the error budget being used by offset in the configurable gain stage 110 and error figures of the A/D converter 120.

Figure 4:
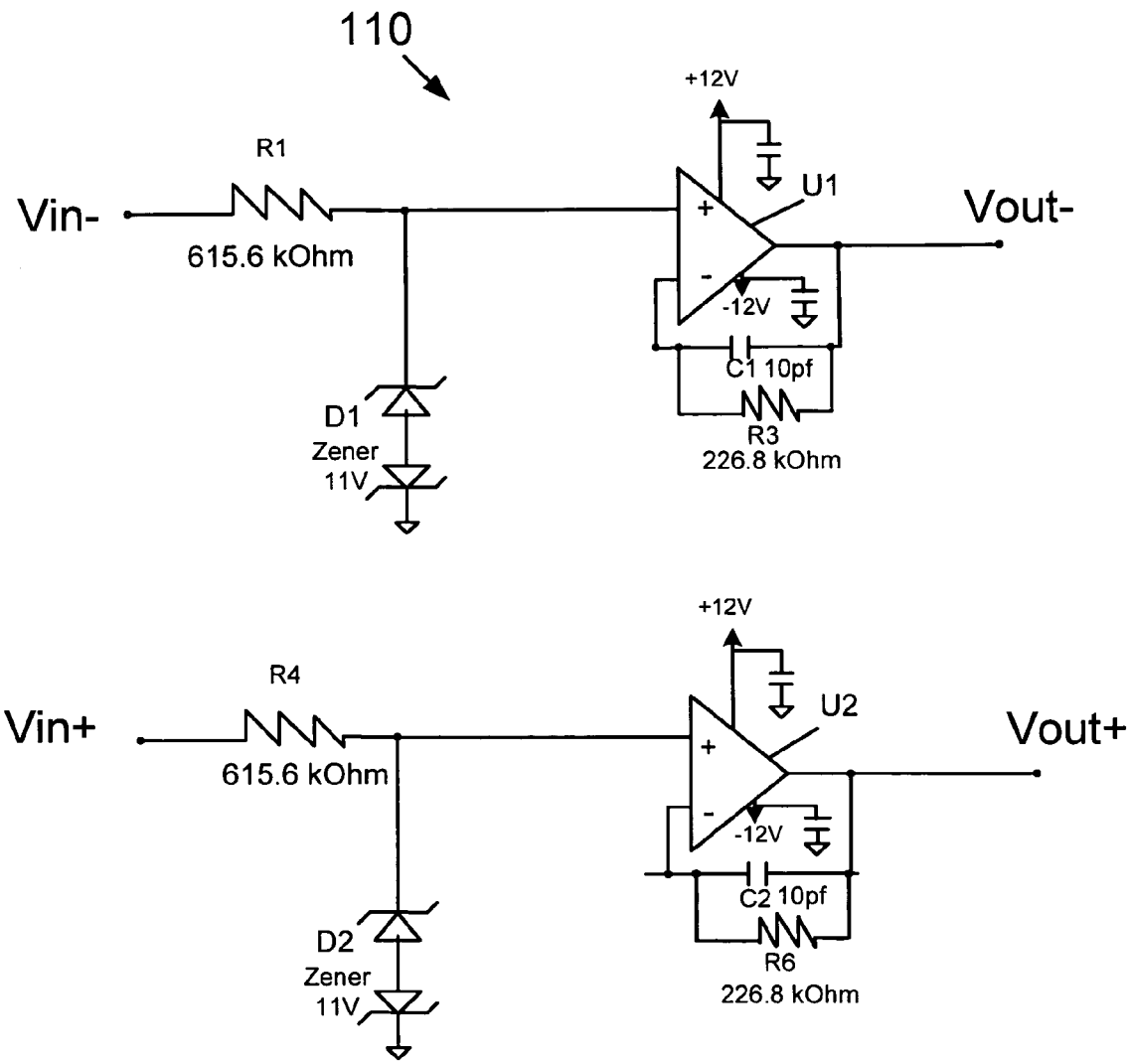
FIG. 4 is a circuit level diagram illustrating the configurable gain stage operating in unity gain mode.

FIG. 4 shows the topology of the configurable gain stage 110 in the unity gain (Gain=1) mode. This mode of operation is suitable when the input signal voltage range is in a proper range for input to an A/D, but where a high input impedance/low input impedance buffer is needed. In this mode, the 32.4 k$\Omega$ resistor R2, R5 are not switched in as either a voltage divider or to create amplification around the operational amplifiers U1 and U2. Hence the circuit of FIG. 4 has G=1 and no gain error. The main component of the error in the G=1 mode is due to leakage currents at the inputs of the operational amplifiers U1, U2, and the voltage drops they create across the 615.6 k$\Omega$ resistors R1, R4, and 226.8 k$\Omega$ resistors R3, R6, as well as the offset voltage of the operational amplifiers U1, U2. In the preferred embodiment, the operational amplifiers are OP4177ARU operational amplifiers, which have the following properties: $V_{OS}=\pm120$ μV, $I_{BIAS}=\pm2$ nA, $I_{OFFSET}=\pm2$ nA, worst case, $-40°$ C.$<T_A<125°$ C. Thus, the offset error in the preferred embodiment is:

$$V_{OS} + V_{R615.6} + V_{R226.6} \quad (15)$$

$$= V_{OS} + (I_{BIAS} + I_{OFFSET})*615.6 \text{ K} + \quad (16)$$
$$(I_{BIAS} + I_{OFFSET})*226.8 \text{ K}$$

$$= 2.647 \text{ mV}$$

for one leg of the circuit. As the errors can be positive of negative, the absolute worst case would occur when one leg's error is opposite the other leg's error, giving a total error of 2.647 mV+2.647 mV=5.294 mV. On a $\pm10$V full-scale range of the A/D 120, this would correspond to a 0.05294% error. On the smallest full-scale A/D range likely to be used in the preferred embodiment, $\pm1.25$V, this would correspond to a 0.424% error.

Figure 5:
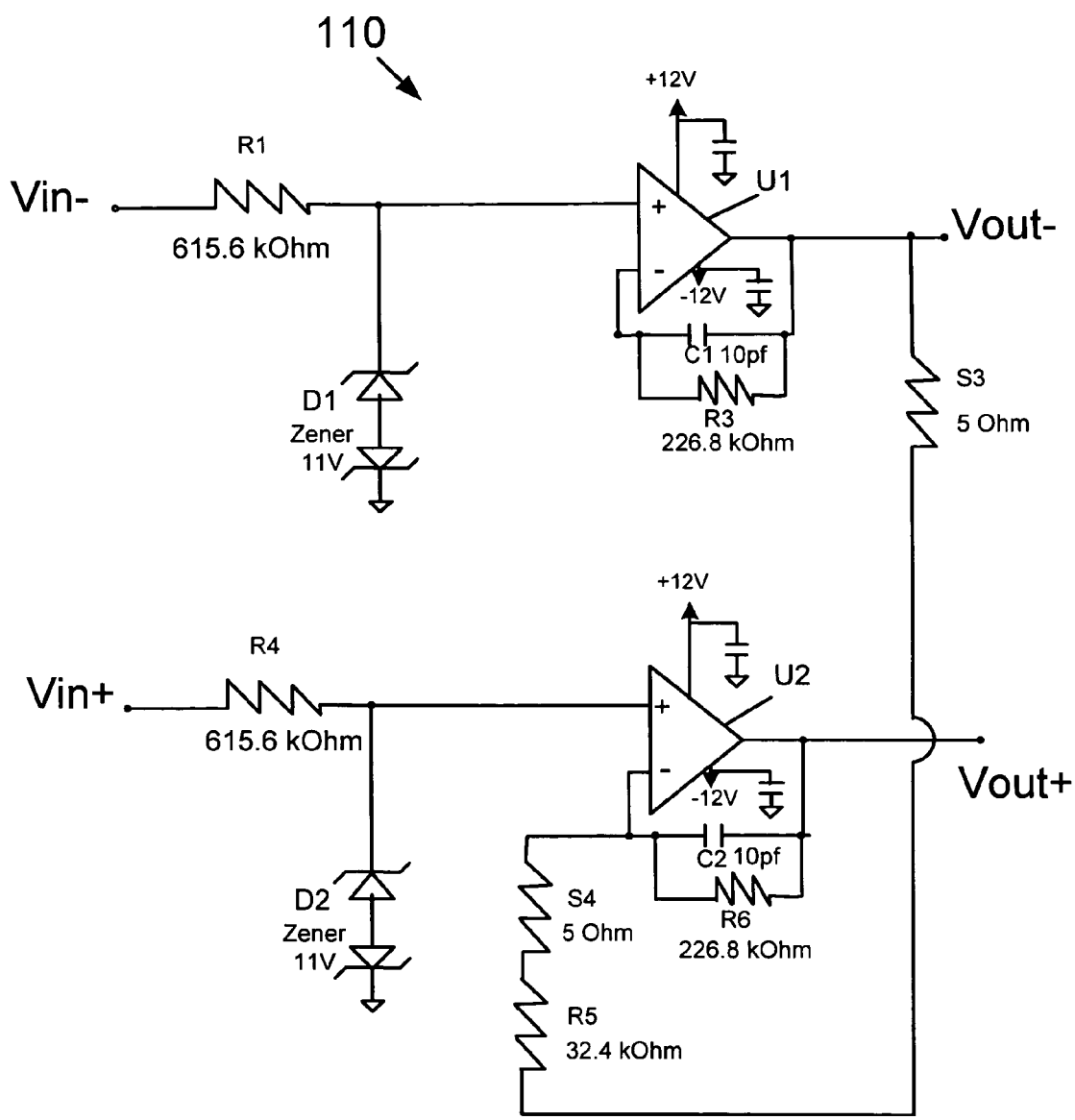
FIG. 5 is a circuit level diagram illustrating the configurable gain stage operating in positive gain mode.

FIG. 5 shows the configurable gain stage 110 operating in the gain mode (gain>1). This mode of operation is useful when the input voltage range is small, such as $\pm0.3125$ V input range, whereby that small input range is expanded to a $\pm2.5$V input range that is suitable for input to the A/D 120. In this mode, the negative side of the differential is coupled to $V_{IN-}$, and the voltage is buffered through operational amplifier U1 with no gain. Switch S3 is closed, so that the low side of resistor R5 is attached to $V_{out-}$. Switch S4 is closed, to connect resistor R5 to resistor R6, to thereby form an amplifier around operational amplifier U2 with Gain= (226.8+32.4)/32.4=8. In effect, operational amplifier U2 and resistors R5 and R6 act as a basic non-inverting amplifier. Instead of being referenced to ground, this amplifier is referenced to $V_{out-}$, which is equal to $V_{IN-}$. This method of achieving 8× gain differential gain is more tolerant of common mode voltage than if both legs of the configurable gain stage 110 had gains of 8, to follow the approach of the G=0.05 attenuation mode.

As it is, the ideal gains for the configurable gain stage in the gain mode are:

$$V_{OUT-} = V_{IN-} \quad (17)$$

$$V_{OUT+} = V_{IN-} + (V_{IN+} - V_{OUT-})*8 \text{ or} \quad (18)$$

$$G_{DIFF} = V_{outdiff}/V_{indiff} = V_{OUT+} - V_{OUT-}/V_{IN+} - V_{IN-} \quad (19)$$
$$= 8(V_{IN+} - V_{IN-})/(V_{IN+} - V_{IN-}) = 8$$

Error in the configurable gain stage 110 is caused by bias currents and offset voltages in the operational amplifiers U1, U2, which cause offset errors similar to those discussed for the Gain=1 operation mode. Error in the configurable gain stage 110 is also caused by resistance ratio errors due to the tolerances of resistors R5 and R6, and the finite resistance values of switches S3 and S4, when theoretically acting as closed switches, all of which creates a gain error.

Offset in the negative leg of the configurable gain stage 110 is the same as in the Gain=1 case, 2.647 mV. Offset in the positive leg of the configurable gain stage 110 differs because of the 32.4 kΩ resistor R5 is switched in (by switches S3, S4 and S5 being closed), whereby negative current is split between the 32.4 kΩ resistor R5 and the 226.8 kΩ resistor R6. Also, since the error due to this combination is added to the output rather than to the input, it should be divided by gain to reference it to the input. The expression for offset is then computed as:

$$V_{OS} + (I_{BIAS} + I_{OFFSET}) * 615.6 \text{ k}\Omega * \tfrac{1}{8} * 226.8 \text{ k}\Omega (I_{BIAS} + I_{OFFSET}) \ldots (32.4 \text{ k}\Omega/(226.8 \text{ k}\Omega + 32.4 \text{ k}\Omega) = 1.92 \text{ mV} \quad (20)$$

In the worst possible case, the polarities of the two operational amplifiers U1, U2 would be oriented so that the positive leg and the negative leg offsets would be in opposite directions, resulting in a total offset of their sum: $V_{OS}$=2.647 mV+1.92 mV=4.567 mV, as referenced to the input.

Including error terms, the DC gain equation is:

$$G = (R_6 \pm R_{6error} + R_5 \pm R_{5error})/(R_{S4} + R_{S3} + R_5 \pm R_{5error}) \quad (21)$$

$$= (226.8 \text{ k}\Omega \pm 0.45 \text{ k}\Omega + 32.4 \text{ k}\Omega \pm 0.0065 \text{ k}\Omega)/$$

$$(5\Omega + 32.4 \text{ k}\Omega + 5\Omega + 0.0065 \text{ k}\Omega) \quad (22)$$

The lowest gain would occur with resistor R6 at the negative end of its tolerance, with resistor R5 at the positive end of its tolerance, and with both switches at 5 Ω, which results in:

$$G_{LOW} = (226755 + 32406.5)/(5 + 5 + 32406.5) = 7.9974 \quad (23)$$

for a gain error of −0.00526.

The highest gain would occur with resistor R6 at the positive end of its tolerance, with resistor R5 at the negative end of its tolerance, and with both switches at zero (0) resistance, which results in:

$$G_{HIGH} = (226845 + 32893.5)/(32395.5) = 0.00280 \quad (24)$$

for a gain error of 0.00280.

Figure 6:
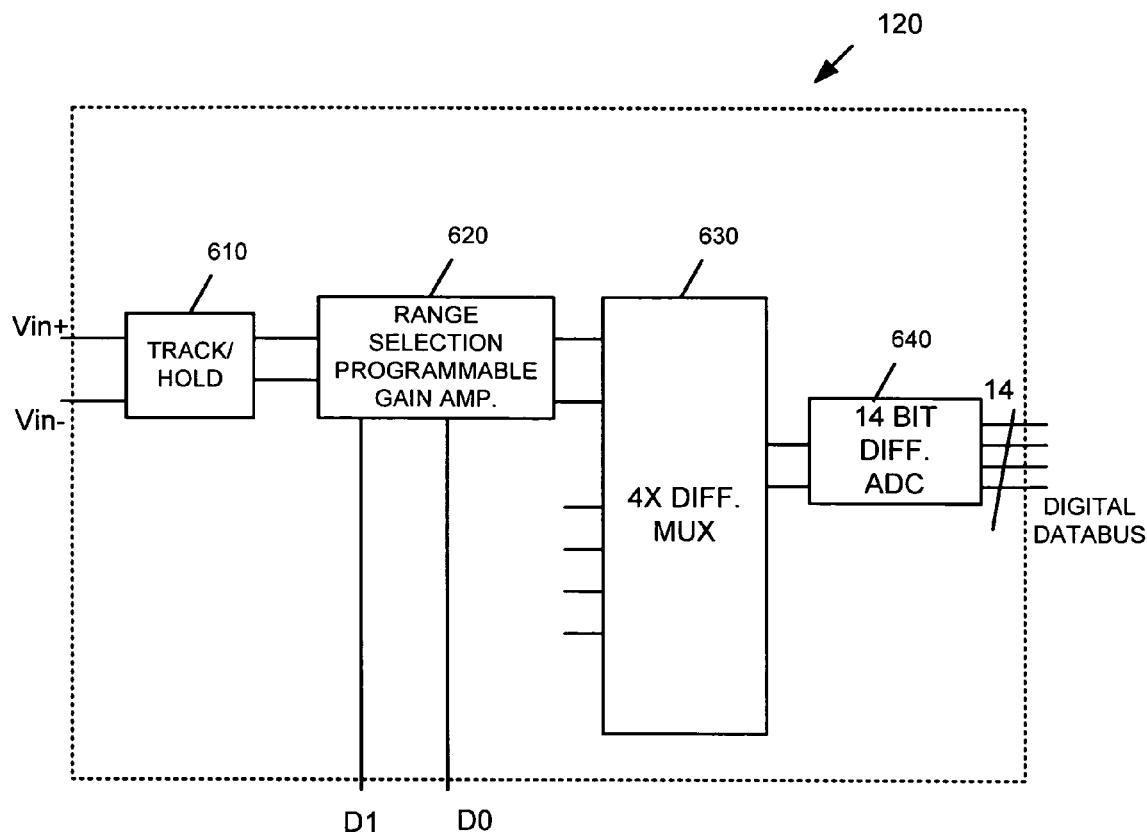
FIG. 6 is a block diagram illustrating an analog-to-digital converter that can be utilized according to a preferred configuration of the first embodiment.

The discussion will now turn to the Analog-to-Digital Converter 120, which forms part of the unified analog input front end 100. As discussed above, the Analog-to-Digital Converter 120 corresponds to an ACGO 4-Channel, 14-bit differential A-D converter in the preferred embodiment, but one of ordinary skill in the art will recognize that any type or model of A-D converter may be utilized, while remaining within the spirit and scope of the present invention. FIG. 6 shows details of the ACGO A-D Converter 120. A track-and-hold circuit 610 allows all four channels to be sampled simultaneously and converted in sequence by a single block of conversion circuitry.

A range selection circuit 620, which is implemented as a programmable gate array in the preferred embodiment, allows the A-D converter 120 to be configured for a plurality of different ranges on a channel-by-channel basis by way of digital commands (signals D0, D1) input to the A-D Converter 120. In the preferred embodiment, the different ranges correspond to: ±10V, ±5V, ±2.5V, ±1.25V. One of ordinary skill in the art will recognize that the number of possible ranges, and the actual values of those ranges, may be different from the ones discussed above with respect to the preferred embodiment, while remaining within the spirit and scope of the invention.

As shown in FIG. 6, the A-D Converter 120 also includes a differential multiplexer 630 (4× differential multiplexer in the preferred embodiment) and an N-bit differential A-D Converter stage 640 (where N=14 in the preferred embodiment). The 4×differential multiplexer 630 of the A-D Converter 120 of the preferred embodiment is capable of received up to four (4) separate differential inputs at the same time, and to output them sequentially to the A-D Converter stage 640, for conversion to a digital (e.g., 14-bit) value.

Error specifications for the A-D Converter 120 according to the preferred embodiment of the invention are provided by the manufacturer (Maxim) as end-to-end tolerances (mostly in LSB, or least significant bits), including errors resident in all stages of the A-D Converter 120. Errors can be classified as either offset errors (errors independent of input and temperature) or gain errors (errors dependent upon input). The offset error sum for the A-D Converter 120 according to the preferred embodiment of the invention is equal to ±11 LSB=0.122% full scale. The gain error sum for the A-D Converter 120 according to the preferred embodiment of the invention is equal to 158 LSB=1.929% full scale.

It is desirable to keep the gain error to an acceptable low value. To do this requires the use of a calibration circuit. The previous discussion of the configurable gain stage 110 somewhat overestimates the effect of bias currents on the operational amplifiers U1, U2 when calculating offset error for the three states (or modes of operation) of the configurable gain stage 110 (also, offset calculation was neglected entirely for the Gain=1 state). Bias and offset current sizes used in the previous calculations were taken from "Max" specification values from a datasheet for the OP4177 operational amplifiers utilized in the preferred embodiment, and it is assumed that matching between any two gates (even in the same package) is a random distribution from −Max to +Max. This is a simplistic approach that does not take into account the actual temperature behavior of the OP4177 operational amplifiers.

As such, the offset voltages for the configurable gain stage 110 may be calculated as:

$$G = 0.05 \text{ mode:} \quad (26)$$
$$V_{OS} = 2 V_{OSopamp} + (1/(1/615.6 \text{ K} + 1/32.4 \text{ K}))(I_{BIAS_\Delta} + I_{OFF_\Delta})$$

$$G = 1 \text{ mode:} \quad (27)$$
$$V_{OS} = 2 V_{OSopamp} + 615.6 \text{ K}(I_{BIAS_\Delta} + I_{OFF_\Delta}) + 226.8(I_{BIAS_\Delta} + I_{OFF_\Delta})$$

$$G = 8 \text{ mode:} \quad (28)$$
$$V_{OS} = 2 V_{OSopamp} + 615.6 \text{ K}(I_{BIAS_\Delta} + I_{OFF_\Delta}) + 32.4(I_{BIAS_\Delta} + I_{OFF_\Delta})(226.8)/32.4 + 226.8) + 1/8 * 226.8((I_{BIAS_\Delta} + I_{OFF_\Delta})(32.4)/(32.4 + 226.8)$$

where $V_{OSopamp}$ is the specified offset voltage of the particular type of operational amplifiers used for operational amplifiers U1, U2, and where $I_{BIAS_\Delta}$ and $I_{OFF_\Delta}$ are the maximum expected differences in current considering the minimum current to be Zero (0) and the maximum current to be the datasheet "typical" specification value (0.5, 0.2 nA for the 4177 operational amplifier).

Figure 7:
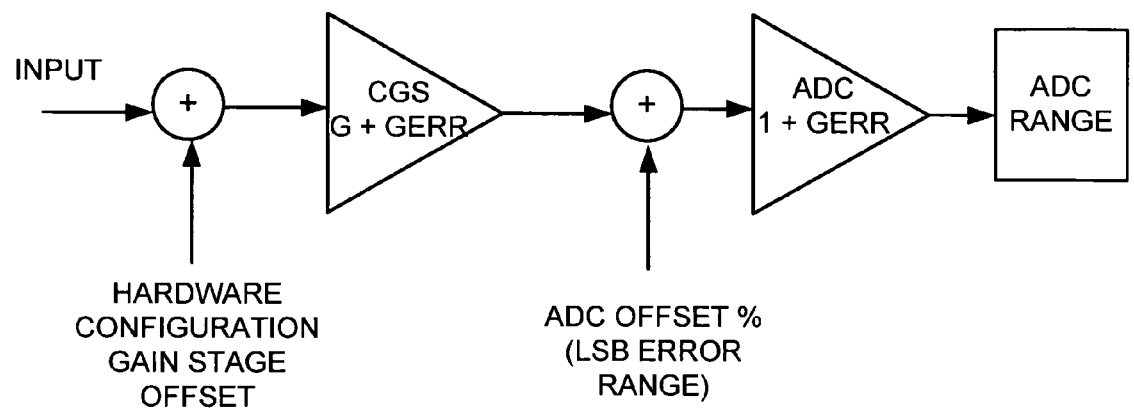
FIG. 7 is a block diagram illustrating the error effects on the system according to the first embodiment.

Accordingly, the offset voltages are:

$G=0.05 \rightarrow V_{OS}=0.4203$ mV $G=1 \rightarrow V_{OS}=0.8298$ mV $G=8 \rightarrow V_{OS}=0.6930$ mV With gain and offset errors existing for both the configurable gain stage 110 and for the A-D Converter 120 of the unified analog input front end 100, a block diagram can be constructed to show the error effects on the entire system, and FIG. 7 is such a block diagram. The gain of the A-D Converter 120 is shown an one (unity), as the block diagram envisions the circuit mapping an input voltage range to a selected A-D range. Internal to the A-D Converter 120, the range selection programmable gate array is set to an appropriate gain to map the selected range to an internal converter range of the A-D Converter 120, with some error included in the A-D Converter 120 as denoted by $G_{err}$. However, since the A-D Converter errors are specified mostly in LSBs and in dB, which make the figures themselves scalable to the selected range, it is convenient to express the ideal A-D Converter gain as One (1), and the ideal output for a full scale input ($FS_{IN}$) as $ADC_{MAX}$, which corresponds to the maximum value for a given range. Thus, the equation for the combined errors effects is:

$$(FS_{IN} + CGS_{OFF})(CGS_{GERR} + CGS_{GAIN})\_ + \qquad (29)$$
$$(ADC_{OFF\%} * ADC_{MAX})(1 + ADCG_{ERR}) = ADC_{MAX} + FS_{ERROR}$$

$$FS_{ERROR\%} = 100 * FS_{ERROR} / ADC_{MAX} \qquad (30)$$

So, full scale error percentage can be found by subtracting $ADC_{MAX}$ from Equation (29), and dividing by $ADC_{MAX}$. Since $ADC_{MAX}$ is the ideal full scale input response and is equal to $FS_{IN} * CGS_{GAIN}$, a simplified expression for $FS_{ERROR\%}$ is:

$$FS_{ERROR\%} = (((CGS_{ERR\_}CGSG_{ERR} * ADDG_{ERR}) / CGSG_{GAIN}) + \qquad (31)$$
$$((CGS_{OFF} + ADC_{ERR} * CGS_{OFF}) / FS_{IN}) +$$
$$((CGS_{OFF} * CGSG_{ERR} + ADCG_{ERR} * CGSG_{ERR} + * CGS_{OFF} +$$
$$ADC_{OFF} * ADCG_{ERR}) / ADC_{MAX}) +$$
$$ADCG_{ERR} + ADC_{OFF}) * 100$$

If the error terms are small, the product of any two error terms is very small. Considering any error product to be negligible, $FS_{ERROR\%}$ can be approximated as:

$$FS_{ERROR\%} \simeq ((CGSG_{ERR} / CGSG_{GAIN}) + \qquad (32)$$
$$(CGS_{OFF} / FS_{IN}) + (ADCG_{ERR} + ADC_{OFF})) * 100$$

which corresponds to the sum of all of the relative errors in the unified analog input front end 100, as one might intuitively expect.

Using Equation (31), Full Scale Error % ($FS_{Err}$ %) is tabulated in Table 1, below, for twelve Gain/Range combinations for the unified analog input front end 100 of the preferred embodiment.

TABLE I

WORST CASE ERROR CALCULATIONS

| FS in | CGS GAIN | ADC MAX | $CGS_{OFF}(V)$ | CGS V GERR V | $ADC_{OFF}$ V V | ADC V GERR V | $FS_{ERR}$ % |
|---|---|---|---|---|---|---|---|
| 200 | 0.05 | 10 | 0.0004203 | 0.00003 | 0.00122 | 0.01929 | 2.1147 |
| 100 | 0.05 | 5 | 0.0004203 | 0.00003 | 0.00122 | 0.01929 | 2.1149 |
| 50 | 0.05 | 2.5 | 0.0004203 | 0.00003 | 0.00122 | 0.01929 | 2.1153 |
| 25 | 0.05 | 1.25 | 0.0004203 | 0.00003 | 0.00122 | 0.01929 | 2.1162 |
| 10 | 1 | 10 | 0.0008297 | 0 | 0.00122 | 0.01929 | 2.0618 |
| 5 | 1 | 5 | 0.0008297 | 0 | 0.00122 | 0.01929 | 2.0703 |
| 2.5 | 1 | 2.5 | 0.0008297 | 0 | 0.00122 | 0.01929 | 2.0872 |
| *1.25 | 1 | 1.25 | 0.0008297 | 0 | 0.00122 | 0.01929 | 2.1210 |
| *1.25 | 8 | 10 | 0.0006930 | 0.00526 | 0.00122 | 0.01929 | 2.1769 |
| 0.625 | 8 | 5 | 0.0006930 | 0.00526 | 0.00122 | 0.01929 | 2.3466 |
| 0.3125 | 8 | 2.5 | 0.0006930 | 0.00526 | 0.00122 | 0.01929 | 2.5727 |
| 0.15625 | 8 | 1.25 | 0.0006930 | 0.00526 | 0.00122 | 0.01929 | 2.2335 |

*Two combinations result in a 1.25 V full scale

As can be seen in Table 1, channel errors are above 1%. This means that to achieve a target accuracy of <1%, some form of calibration has to be performed on the unified analog input front end 100. ADC Gain Error and 8×Gain Error in the configurable gain stage 110 appear to be the largest error sources, and so a calibration method and apparatus should be designed so as to greatly reduce and/or eliminate those errors specifically.

Figure 8:
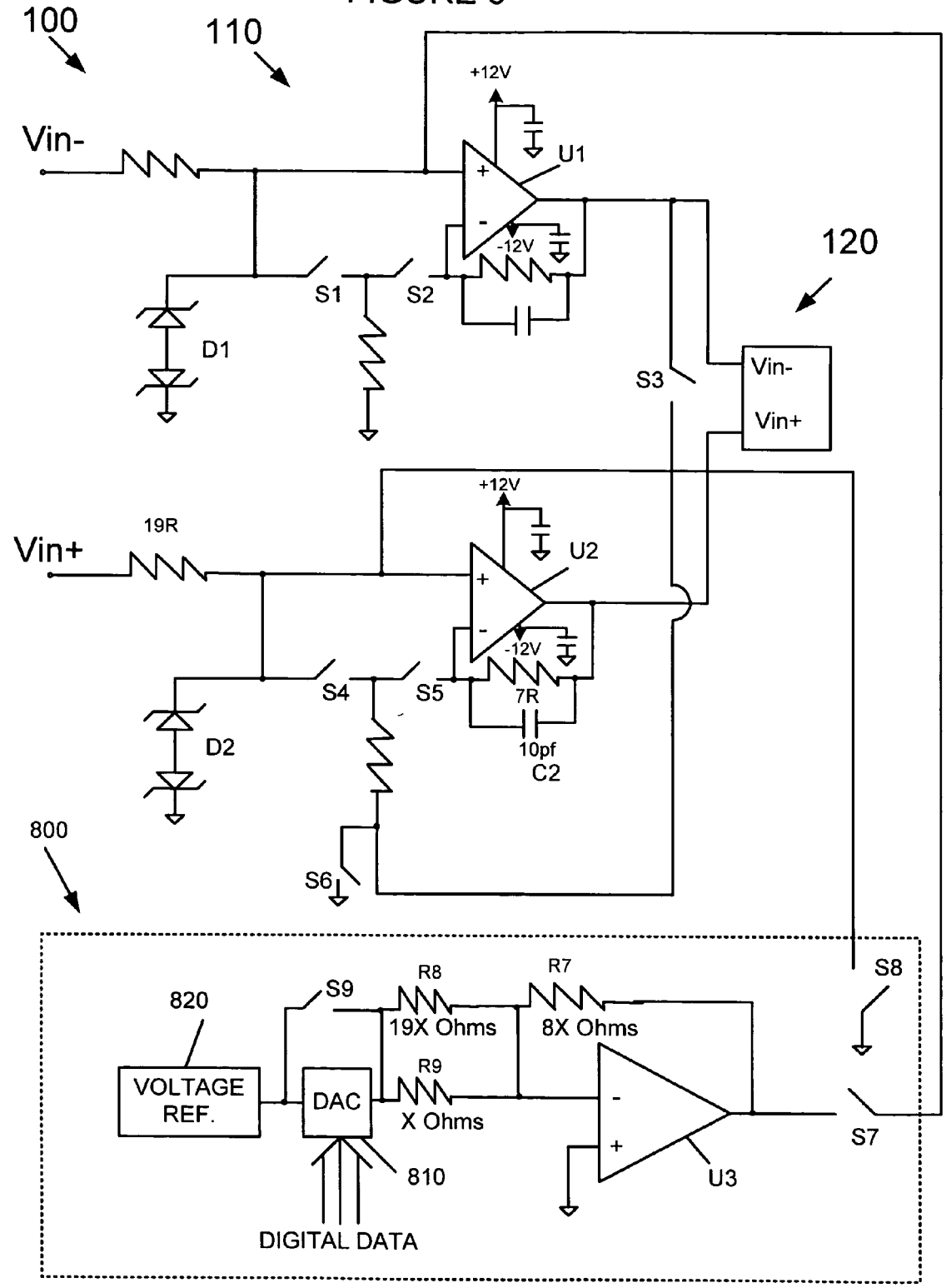
FIG. 8 is a block diagram illustrating a calibration unit coupled to a unified analog input front end, according to a second embodiment of the invention.

FIG. 8 shows a unified analog input front end 100 with a calibration circuit 800, according to a second embodiment of the invention. Since switches S1 and S4 are always open during calibration, the only loads on the calibration output will be the 615.6 kΩ and 226.8 kΩ resistors and the input leakage of the operational amplifiers U1 and U2. A single channel current draw will be low, and so one calibration circuit 800 can be utilized to service many input channels, such as the two channels of the configurable gain stage 110.

As shown in FIG. 8, the calibration circuit 800 includes an operational amplifier U3, resistors R7, R8, R9, switches S7, S8, S9, a digital-to-analog converter (DAC) 810, and a voltage reference unit 820 (2.5 V reference in the preferred embodiment).

Figure 9:
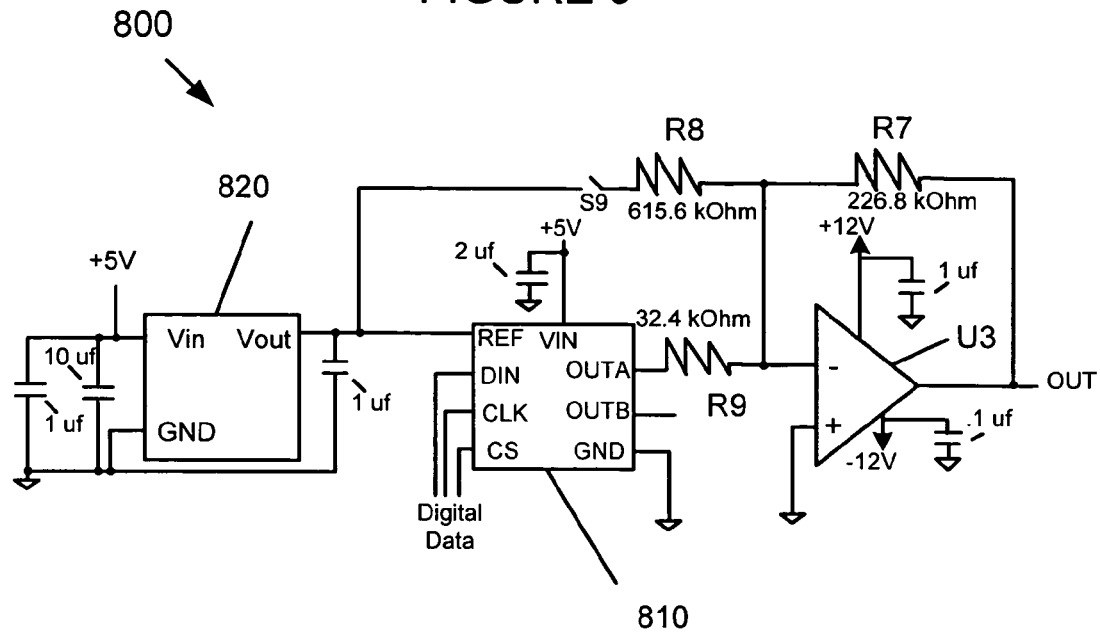
FIG. 9 is a circuit level diagram illustrating the calibration unit according to a preferred configuration of the second embodiment.

FIG. 9 shows a more detailed diagram of the calibration circuit 800, with component types specified for the preferred embodiment. The voltage reference unit 820 is shown as a type ADR421A. Capacitors C1, C2 and C3 are coupled to the ADR421A, and a +5V reference voltage is provided to a VIN input of the ADR421A. The DAC 810 is shown as a MAX 5223 DAC, which inputs digital data on its DIN (data in), CLK (clock), and CS (chip select) inputs. The operational amplifier U3 is shown as a type 4177. Resistor R7 is shown as a 226.8 kΩ resistor, resistor R8 is shown as a 615.6 kΩ resistor, and resistor R9 is shown as a 32.4 kΩ resistor in the preferred embodiment of the calibration circuit 800. One of ordinary skill in the art will recognize that the types of devices shown in the FIG. 9, as well as the values for the resistors and capacitors and voltage reference units shown in that figure, are exemplary, and whereby other values may be utilized while remaining within the spirit and scope of the invention.

By switching switch S9 open and closed, the output can be changed by $2.5*(-226.8/615.6)=-0.92105$ V. Due to the precision of the resistors and the accuracy of the 2.5 V reference, this delta is very accurate, and it is on this accuracy that the calibration scheme mainly relies. The accuracy of the DAC 810 is not very important, and it is only used to move the calibration point. A moveable calibration point is desirable when dealing with ADC's (such as ADC 120) that may be set to several ranges. Also, by finding gain errors near multiple points in the same ADC range and averaging them, this method avoids being corrupted by an unrepresentative local gain error caused by nonlinearity in the ADC. Since Differential Non-Linearity (DNL) is even-symmetric around all major carriers, a set of calibration points regularly spaced across the scale should minimize the effect of any one local DNL on an overall gain error measurement. Additionally, the measure-switch-measure approach to finding the delta caused by closing switch S9 ensures that any offset errors in the unified analog input front end 100 or in the calibration circuit 800 are canceled out by the subtraction of one measurement from another. This method focuses on gain error only, and offsets have no effect on the accuracy of the gain calibration constant being calculated.

Error in the calibration measurement is caused only by inaccuracy in the reference voltage, mismatch in the 615.6 kΩ and 226.8 kΩ resistors, and noise differences between the first and second measurements. Unfiltered noise on the output of the DAC 120 is not negligible, but its effects are mitigated in this embodiment by the inherent averaging of the moving calibration point approach. Additional averaging at each calibration point and/or state of switch S9 can also be performed, in an alternative configuration of a calibration method in accordance with an embodiment of the present invention.

A gain calibration factor for a certain calibration point is found by the following equation, where $X_1$=measured value with switch S9 open, and $X_2$=measured value with switch S9 closed:

$$G_{CF}=0.92105/(X_1-X_2)$$

Values of $G_{CF}$ acquired at different calibration points are then averaged, to obtain a calibration point for the unified analog input front end 100. Error in this factor is related only to error sources that cannot be arithmetically canceled out by the subtraction $X_1-X_2$: the error of the reference voltage and the gain error of the 226.8 kΩ/615.6 kΩ amplification around the operational amplifier U3. Gain calibration factor error is computed as:

$$G_{CFERR}=(((REF+REF_{ERR})((226.8\pm0.02\%)/(615.6\pm0.02\%)))/0.92105)-1 \quad (33)$$

With an ADR421A component used as the voltage reference unit in the preferred embodiment of the calibration circuit 800, $REF_{ERR}$ is ±3 mV, assuming that calibration will take place once, at a temperature of around 25° C.

$$G_{CFERRHI}=((2.503(226.84536/615.47688))/0.92105)-1=0.16\% \quad (34)$$

$$G_{CFERRLO}=((2.497(226.75464/615.72312))/0.92105)-1=-0.16\% \quad (35)$$

So, $G_{CF}$ has an accuracy of ±0.16%.

$G_{CF}$ is the ratio of ideal gain to actual gain, and $G_{CFERROR}$ is the factor by which $G_{CF}$ itself is in error. So, the actual value is:

$$G_{CFACTUAL}=G_{CF}(1+G_{CFERR})=(1/G_{ACTUAL})(1+G_{CFERR}) \quad (36)$$

The effect of the gain error on output is:

$$V_{out}=V_{in}G_{ACTUAL} \quad (37)$$

So, multiplying by the calculated $G_{CFACTUAL}$ results in:

$$V_{OUT}G_{CFACTUAL}=V_{IN}(G_{ACTUAL}/G_{ACTUAL})(1+G_{CFERR})=V_{IN}(1+G_{CFEFF})$$

So, in effect, calibration replaces the ADC gain error with the error of the calibration method. The errors involved are only those errors present when the calibration actually occurs. If calibration is performed at room temperature, temperature errors in the calibration reference may be ignored, as in Equations #34 and #35 above, but temperature related errors in input circuit gain are not included in the calibration and thus should be included in a sum of ADC gain errors.

Since calibration preferably occurs near the middle of the temperature range, maximum temperature excursion from the calibration point is only one-half of that range, and temperature related gain error is based on one-half of the number calculated previously from internal reference temperature. Specified offset error plus initial internal reference error is a factor which is replaced by $G_{CFERR}$.

Calibration Error % for different range/gain configurations of the unified analog input front end 100 is tabulated below in Table 2, calculated as in Table 1 ($CGS_{OFF}$, $CGS-G_{ERR}$ and $ADC_{OFF}$ values are the same as those shown in Table 1, and thus are not shown in Table 2.

TABLE II

WORST CASE CALIBRATED ERROR

| FSIN | CSG GAIN | $ADC_{MAX}$ | ADC $G_{ERR}$ | $FS_{ERR\%}$ |
|---|---|---|---|---|
| 200 | 0.05 | 10 | .004725 | 0.6556 |
| 100 | 0.05 | 5 | .004725 | 0.6558 |
| 50 | 0.05 | 2.5 | .004725 | 0.6562 |
| 25 | 0.05 | 1.25 | .004725 | 0.6570 |
| 10 | 1 | 0 | .004725 | 0.6034 |
| 5 | 1 | 5 | .004725 | 0.6117 |

TABLE II-continued

WORST CASE CALIBRATED ERROR

| FSIN | CSG GAIN | ADC$_{MAX}$ | ADC G$_{ERR}$ | FS$_{ERR\%}$ |
|---|---|---|---|---|
| 2.5 | 1 | 2.5 | .004725 | 0.6284 |
| 1.25 | 1 | 1.25 | .004725 | 0.6618 |
| 1.25 | 8 | 10 | .004725 | 0.7169 |
| 0.625 | 8 | 5 | .004725 | 0.7726 |
| 0.3125 | 8 | 2.5 | .004725 | 0.8841 |
| 0.15625 | 8 | 1.25 | .004725 | 1.1070 |

As can be seen by the values in Table 2, the calibration circuit 800 lessens the error for the unified analog input front end 100 to an acceptable level of <1% for all but the last range/gain configuration (whereby that one is only slightly above 1%).

In a third embodiment of the invention, referring back to FIG. 1, the zener diodes D1 and D2 are replaced by low-capacitance signal diode clamps (not shown), such as BAV 99 diodes with ±12 V clamping range. The clamp diodes of the third embodiment may experience current leakage greater than an acceptable amount, causing an undesirable offset voltage in the 615.6 kΩ resistors. However, based on the type of clamp diodes being used, the current leakage may be maintained to an acceptable amount.

In a fourth embodiment of the invention, referring back to FIG. 1, the switches may be selected so that they have their own internal protection diodes, such as a Max 313 Quad SPST (Single Pole, Single Throw) switch, which has its own protection diodes to ±12 V. With such switches used in the configurable gain stage, these internal protection diodes of the switches alone can provide the overvoltage protection, and thus there is no need for the zener diodes D1, D2 of the first embodiment in this instance. Furthermore, in the embodiments described above, switch S2 does not get closed for any of the gain modes, and so switch S2 may be removed from the configurable gain stage to thereby leave only five (5) switches in an alternative configuration of the first (or other) embodiments of the configurable gain stage.

Many other changes and modifications may be made to the present invention without departing from the spirit thereof. The scope of these and other changes will become apparent from the appended claims. For example, the configurable gain stage may be utilized to provide an impedance buffer and/or an input signal dynamic range adjustment mechanism for other devices other than A/Ds that are to receive signals output by the configurable gain stage, and that are to process those signals in some way.

What is claimed is:

1. An analog input front end, comprising:
a configurable gain stage that is configured to receive an analog input signal and to provide a gain value to the analog input signal so as to output a gain-adjusted analog input signal that is within a particular voltage range between a maximum and a minimum value; and
an analog-to-digital converter that is configured to receive the gain-adjusted analog input signal output from the configurable gain stage, and to perform analog-to-digital conversion on the gain-adjusted analog input signal, so as to output a digital signal that is indicative of the analog input signal,
wherein the configurable gain stage comprises:
a positive differential input signal stage including a first operational amplifier; and
a negative differential input signal stage including a second operational amplifier,
wherein the positive differential input signal stage further comprises:
a first resistor and a first capacitor connected across the first operational amplifier and acting as a first frequency filter, and
wherein the negative differential input signal stage further comprises:
a second resistor and a second capacitor connected across the second operational amplifier and acting as a second frequency filter.

2. The analog input front end according to claim 1, wherein the positive differential input signal stage further comprises:
a first switch and a second switch capable of being switched so as to cause the positive differential gain stage to operate in an attenuation mode, a unity gain mode, and in a greater-than-unity gain mode; and
wherein the negative differential input signal stage further comprises:
a third switch and a fourth switch capable of being switched so as to cause the negative differential gain stage to operate in the attenuation mode and the unity gain mode, and in the greater-than-unity gain mode.

3. The analog input front end according to claim 2, further comprising:
a fifth switch provided between an output of the first operational amplifier of the positive differential gain stage and an input of the second operational amplifier of the negative differential gain stage.

4. A configurable gain stage, comprising:
a positive differential input signal stage that includes a first resistor having a first resistance value, a second resistor having a second resistance value, and a first operational amplifier; and
a negative differential input signal stage that includes a third resistor having the first resistance value, a fourth resistor having the second resistance value, and a second operational amplifier; and
first through sixth switches, the first and second switches being provided on the positive differential input signal stage, the third and fourth switches being provided on the negative differential input signal stage, the fifth switch being provided between the positive and negative differential input signal stages, and the sixth switch being provided between a ground potential and at least one of the positive and negative differential input signal stages,
wherein the configurable gain stage is capable of operating in a first mode of operation providing a gain value greater than unity to an input differential signal pair, a second mode of operation providing a unity gain value to the input differential signal pair, and a third mode of operation provide a gain value greater than zero but less than unity to the input differential signal pair.

5. The configurable gain stage according to claim 4, wherein the configurable gain stage includes means for providing an impedance buffer for signals to be processed by another device coupled at an output end of the configurable gain stage.

6. The configurable gain stage according to claim 4, wherein the configurable gain stage is coupled to an A/D converter, to act as both an impedance buffer and a dynamic range controller for signals to be processed by the A/D converter.

7. The configurable gain stage according to claim 4, further comprising:

a calibration control unit configured to control the configurable gain stage such that a maximum gain error of the configurable gain stage is less than a predetermined value for all operating states of the configurable gain stage.

8. The configurable gain stage according to claim 7, wherein the calibration control unit comprises:

an operational amplifier;

a resistor ladder circuit connected to the operational amplifier;

a digital-to-analog converter connected to the operational amplifier and to the resistor ladder;

a switch; and a voltage reference unit connected to the resistor ladder by way of the switch, the voltage reference unit also being connected to the digital-to-analog converter.

9. A calibration circuit for a gain stage and analog-to-digital converter unit, the calibration circuit comprising:

an operational amplifier;

a digital-to-analog converter;

a resistor ladder provided between the operational amplifier and the digital-to-analog converter;

a voltage reference unit connected to the digital-to-analog converter; and a plurality of switches that provide an on/off connection to the gain stage and the analog-to-digital converter unit, wherein the calibration circuit is configured to maintain a total error of the gain stage and the analog-to-digital converter unit to be less than a predetermined value, for all operating modes of the gain stage and the analog-to-digital converter.

10. The calibration circuit according to claim 9, further comprising:

a resistor provided between an input port and an output port of the operational amplifier.

11. The calibration circuit according to claim 10, wherein the resistor has a predetermined resistance value with respect to a plurality of resistors making up the resistor ladder.

12. The calibration circuit according to claim 9, wherein the digital-to-analog converter is configured to receive digital data, as calibration instructions, for the calibration circuit.

13. The calibration circuit according to claim 9, further comprising:

a switch provided between at least one resistor of the resistor ladder and the voltage reference unit.

* * * * *